United States Patent
Bathan et al.

(10) Patent No.: US 9,034,692 B2
(45) Date of Patent: May 19, 2015

(54) INTEGRATED CIRCUIT PACKAGING SYSTEM WITH A FLIP CHIP AND METHOD OF MANUFACTURE THEREOF

(75) Inventors: Henry Descalzo Bathan, Singapore (SG); Zigmund Ramirez Camacho, Singapore (SG); Jairus Legaspi Pisigan, Singapore (SG)

(73) Assignee: STATS ChipPAC Ltd., Singapore (SG)

(*) Notice: Subject to any disclaimer, the term of this patent is extended or adjusted under 35 U.S.C. 154(b) by 78 days.

(21) Appl. No.: 13/052,816

(22) Filed: Mar. 21, 2011

(65) Prior Publication Data

US 2012/0241983 A1  Sep. 27, 2012

(51) Int. Cl.
*H01L 21/00* (2006.01)
*H01L 23/31* (2006.01)
*H01L 23/495* (2006.01)
*H01L 25/065* (2006.01)
*H01L 25/03* (2006.01)

(52) U.S. Cl.
CPC ........ *H01L 23/3107* (2013.01); *H01L 23/3135* (2013.01); *H01L 23/49541* (2013.01); *H01L 23/49575* (2013.01); *H01L 25/0657* (2013.01); *H01L 2225/06586* (2013.01); *H01L 2225/06555* (2013.01); *H01L 25/03* (2013.01); *H01L 2225/06513* (2013.01); *H01L 2224/16145* (2013.01); *H01L 2224/16245* (2013.01); *H01L 2224/32145* (2013.01); *H01L 2224/73204* (2013.01); *H01L 2224/73253* (2013.01); *H01L 2224/32245* (2013.01); *H01L 2224/48091* (2013.01); *H01L 2224/73265* (2013.01)

(58) Field of Classification Search
USPC ................ 257/686, 777, 723, 724, 666, 676; 438/107, 108, 109, 127
See application file for complete search history.

(56) References Cited

U.S. PATENT DOCUMENTS

| | | | |
|---|---|---|---|
| 6,077,724 A | 6/2000 | Chen | |
| 6,507,098 B1 * | 1/2003 | Lo et al. | 257/686 |
| 6,590,281 B2 * | 7/2003 | Wu et al. | 257/684 |
| 6,607,937 B1 * | 8/2003 | Corisis | 438/108 |
| 6,759,737 B2 | 7/2004 | Seo et al. | |
| 6,921,968 B2 | 7/2005 | Chung | |
| 7,180,166 B2 * | 2/2007 | Ho et al. | 257/686 |
| 7,196,416 B2 | 3/2007 | Hochstenbach et al. | |
| 7,405,104 B2 | 7/2008 | Minamio et al. | |
| 7,473,989 B2 | 1/2009 | Yang et al. | |
| 7,598,606 B2 | 10/2009 | Chow et al. | |
| 7,750,451 B2 | 7/2010 | Camacho et al. | |
| 7,843,047 B2 * | 11/2010 | Kuan et al. | 257/676 |
| 7,915,724 B2 * | 3/2011 | Ha et al. | 257/686 |
| 7,969,018 B2 * | 6/2011 | Otremba et al. | 257/777 |
| 8,053,883 B2 * | 11/2011 | Galera et al. | 257/686 |
| 8,080,867 B2 * | 12/2011 | Camacho et al. | 257/686 |
| 8,178,982 B2 | 5/2012 | Ramakrishna et al. | 257/787 |
| 8,692,387 B2 * | 4/2014 | Qiu et al. | 257/777 |
| 2005/0287705 A1 | 12/2005 | Yang | |
| 2006/0197207 A1 * | 9/2006 | Chow et al. | 257/686 |

(Continued)

*Primary Examiner* — Sheila V Clark
(74) *Attorney, Agent, or Firm* — Ishimaru & Associates LLP

(57) ABSTRACT

A method of manufacture of an integrated circuit packaging system includes: providing a lead; placing an integrated circuit device, having an external connector, adjacent to and electrically isolated from the lead; mounting an integrated circuit over the lead and the integrated circuit device with the integrated circuit electrically isolated from the integrated circuit device; and forming a package encapsulation, having an encapsulation base, over the lead, the integrated circuit, and the integrated circuit device with the lead and the external connector exposed from the encapsulation base.

20 Claims, 2 Drawing Sheets

(56) References Cited

U.S. PATENT DOCUMENTS

| | | |
|---|---|---|
| 2007/0210424 A1 | 9/2007 | Ho et al. |
| 2008/0099784 A1* | 5/2008 | Lo et al. .................. 257/186 |
| 2009/0085178 A1 | 4/2009 | Ha et al. |
| 2009/0127680 A1* | 5/2009 | Do et al. .................. 257/675 |
| 2010/0001391 A1* | 1/2010 | Do et al. .................. 257/686 |

* cited by examiner

INTEGRATED CIRCUIT PACKAGING SYSTEM WITH A FLIP CHIP AND METHOD OF MANUFACTURE THEREOF

TECHNICAL FIELD

The present invention relates generally to an integrated circuit packaging system, and more particularly to a system for an integrated circuit packaging system with a flip chip.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made using the semiconductor package structures. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Many conventional semiconductor (or "chip") packages are of the type where a semiconductor die is molded into a package with a resin, such as an epoxy molding compound. Numerous package approaches stack multiple integrated circuit dice or package in package (PIP) or a combination. Other approaches include package level stacking or package-on-package (POP). POP designs face reliability challenges and higher cost.

Thus, a need still remains for an integrated circuit system improved yield, low profile, and improved reliability. In view of the ever-increasing commercial competitive pressures, along with growing consumer expectations and the diminishing opportunities for meaningful product differentiation in the marketplace, it is increasingly critical that answers be found for these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a lead; placing an integrated circuit device, having an external connector, adjacent to and electrically isolated from the lead; mounting an integrated circuit over the lead and the integrated circuit device with the integrated circuit electrically isolated from the integrated circuit device; and forming a package encapsulation, having an encapsulation base, over the lead, the integrated circuit, and the integrated circuit device with the lead and the external connector exposed from the encapsulation base.

The present invention provides an integrated circuit packaging system, including: a lead; an integrated circuit device, having an external connector, adjacent to and electrically isolated from the integrated circuit device; an integrated circuit over the lead and the integrated circuit device with the integrated circuit electrically isolated from the integrated circuit device; and a package encapsulation, having an encapsulation base, over the lead, the integrated circuit, and the integrated circuit device with the lead and the external connector exposed from the encapsulation base.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
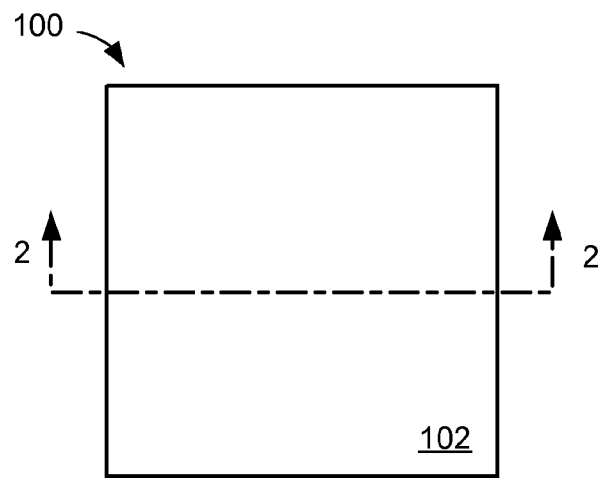
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements or components with no intervening material.

The term "processing" as used herein includes deposition of material or photoresist, patterning, exposure, development, etching, cleaning, and/or removal of the material or photoresist as required in forming a described structure.

Referring now to FIG. 1, therein is shown a top view on an integrated circuit packaging system 100 in a first embodiment of the present invention. The top view depicts a package encapsulation 102. The package encapsulation 102 is a cover, such as a protective covering, that has electric and environmental insulating properties. As an example, the package encapsulation 102 can be formed by molding an encapsulation material such as epoxy molding compound or ceramic material. As an example, the package encapsulation 102 can have characteristics of being formed by a film assisted molding process.

For illustrative purposes, the integrated circuit packaging system 100 is shown with the package encapsulation 102 having a square geometric shape although it is understood that the package encapsulation 102 can have a different geometric shape. For example, the package encapsulation 102 can have a rectangular geometric shape or an octagonal geometric shape.

Figure 2:
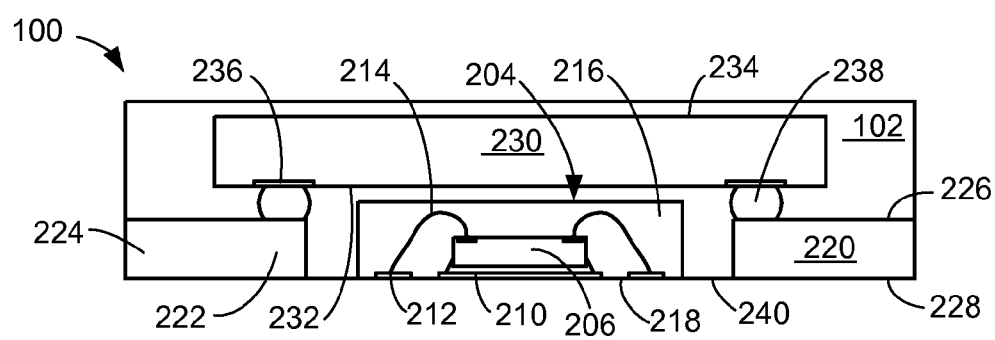
FIG. 2 is a cross-sectional view of the integrated circuit packaging system along line 2—2 of FIG. 1.

Referring now to FIG. 2, therein is shown a cross-sectional view of the integrated circuit packaging system 100 along line 2—2 of FIG. 1. The cross-sectional view depicts an integrated circuit device 204. The integrated circuit device 204 is a packaged internal device, such as an integrated circuit die, with the packaged internal device having active circuitry fabricated thereto (not shown). As an example, the integrated circuit device 204 can be a packaged integrated circuit.

The integrated circuit device 204 can include an internal circuit device 206 mounted over a device paddle 210. The internal circuit device 206 can be a thin integrated circuit, an ultrathin integrated circuit, or a wire bonded die.

The device paddle 210 can be a rigid structure for mounting a device, such as a circuit device. As an example, the device paddle 210 can be a die attach paddle, a heat sink, or a combination thereof. The device paddle 210 can be made from a number of materials, including conductive materials, such as copper, gold, palladium, nickel, silver, tin, aluminum, an alloy, or a combination thereof.

The integrated circuit device 204 can include external connectors 212. The external connectors 212 are conductive pads that provide electrical connectivity for the integrated circuit device 204 and the internal circuit device 206 to external devices. As an example, the external connectors 212 can be pads made from a number of conductive materials, such as copper, gold, palladium, nickel, silver, tin, aluminum, an alloy, any combination thereof, or of a material similar to the material used to form the device paddle 210.

Device interconnects 214 can connect the internal circuit device 206 and the external connectors 212. The device interconnects 214 are conductive connectors that provide electrical connection between components. As examples, the device interconnects 214 can be bond wires or ribbon bond wires.

A device encapsulation 216 can cover the internal circuit device 206 and the device interconnects 214. The device encapsulation 216 provides electrical and environmental insulation to the areas covered. The device encapsulation 216 can be made of materials similar to the package encapsulation 102 or different materials.

The device encapsulation 216 can be over the device paddle 210 and the external connectors 212. The device paddle 210 and the external connectors 212 can be exposed along an external side 218 of the device encapsulation 216. The external side 218 can be exposed to the environment and exposed also by the package encapsulation 102. The exposed portion of the device paddle 210 and the external connectors 212 can be co-planar with the external side 218 of the device encapsulation 216.

Leads 220 can be around the integrated circuit device 204. The leads 220 are conductive structures for mounting support and electrical connectivity of a device. The leads 220 can have a lead inner end 222, which faces the integrated circuit device 204, and a lead outer end 224, which faces away from the integrated circuit device 204. The leads 220 can have a lead top side 226, which faces the package encapsulation 102, and a lead bottom side 228, which faces away from the package encapsulation 102.

The integrated circuit device 204 can be between and adjacent to the leads 220. The lead inner end 222 can be adjacent to the integrated circuit device 204. A vertical side of the lead inner end 222 can face a vertical side of the integrated circuit device 204. The leads 220 and the integrated circuit device 204 are not electrically connected.

The integrated circuit device 204 is electrically isolated from the leads 220. Electrically isolated means that the integrated circuit device 204 is not directly electrically connected to the leads 220 by the structures of the integrated circuit packaging system 100. This does not preclude that the leads 220 and the integrated circuit device 204 can be connected by the next system level (not shown).

An integrated circuit 230 can be mounted over and attached to the leads 220. The integrated circuit 230 is a semiconductor device. As an example, the integrated circuit 230 can be a flip chip. The integrated circuit 230 can have a circuit active side 232 having active circuitry (not shown) fabricated thereto and a circuit non-active side 234. The circuit active side 232 of the integrated circuit 230 can face the lead top side 226.

The integrated circuit 230 can have bond pads 236 along the circuit active side 232 of the integrated circuit 230. The bond pads 236 are conductive pads that provide an electrical interface for connecting the integrated circuit 230 to other devices, components, or structures. As an example, the bond pads 236 can be made from a conductive material, such as copper, a copper alloy, gold, a gold alloy, nickel, a nickel alloy, or other alloys. The bond pads 236 can be co-planar with the circuit active side 232. The bond pads 236 can be located along an outer portion of the circuit active side 232.

The integrated circuit 230 can be attached to the lead inner end 222 with internal interconnects 238. The internal interconnects 238 are conductive structures for electrically connecting components. The internal interconnects 238 can connect the bond pads 236 with the lead inner end 222 along the lead top side 226. Examples of the internal interconnects 238 are solder balls, solder bumps, conductive posts, or conductive pillars.

The integrated circuit 230 can be over the integrated circuit device 204. The circuit active side 232 of the integrated circuit 230 can face the integrated circuit device 204. The integrated circuit 230 can be electrically isolated from the integrated circuit device 204. Electrically isolated means that the integrated circuit device 204 is not electrically connected to the integrated circuit 230 with the structures of the integrated circuit packaging system 100.

The package encapsulation 102 can cover or encapsulate the integrated circuit 230 and the internal interconnects 238. The package encapsulation 102 can cover or encapsulate the leads 220 and the integrated circuit device 204. The lead outer end 224 can be exposed from and co-planar with a vertical side of the package encapsulation 102.

The package encapsulation 102 can have an encapsulation base 240. The lead bottom side 228 and the integrated circuit device 204 can be exposed along the encapsulation base 240. The portion of the integrated circuit device 204 and the lead bottom side 228 can be co-planar with the encapsulation base 240.

The lead bottom side 228 exposed from the encapsulation base 240 and the external connectors 212 of the integrated circuit device 204 exposed along the external side 218 of the device encapsulation 216 can provide the integrated circuit packaging system 100 having inputs and outputs (I/O) of different types and densities. For example, the external connectors 212 can provide a greater number of connections, and thus a higher density of connections, for the integrated circuit device 204 relative to the number of connections provided by the leads 220. As a further example, the external connectors 212 can provide a smaller contact area for connection relative to a larger contact area for the leads 220. In yet a further example, the leads 220 can provide larger contacts arranged along the outer portion of the encapsulation base 240 while the external connectors 212 can provide smaller contacts near the inner portion of the encapsulation base 240.

The package encapsulation 102 can electrically isolate the integrated circuit device 204 by separating the integrated circuit device 204 from the leads 220 and the integrated circuit 230. The package encapsulation 102 can form a physical barrier and insulate the integrated circuit device 204 from the leads 220. Similarly, the package encapsulation 102 can form a physical barrier and insulate the integrated circuit device 204 from the integrated circuit 230.

It has been discovered that the present invention provides the integrated circuit packaging system 100 having improved reliability. The integrated circuit device 204 electrically isolated from the leads 220 and the integrated circuit 230 enables manufactures to test the integrated circuit packaging system 100 as a known good device as a single package compared to a package with the integrated circuit 230 electrically connected to the integrated circuit device 204 thus improving reliability. The integrated circuit device 204 electrically isolated from the leads 220 and the integrated circuit 230 also eliminates the need for separately testing the integrated circuit device 204 and the integrated circuit 230.

It has further been discovered that the present invention provides the integrated circuit packaging system 100 having increased packaging density. The integrated circuit 230 mounted over the leads 220 and the integrated circuit device 204 increases the number of components containing active circuitry, thus increasing overall packaging density.

It has also been discovered that the integrated circuit packaging system 100 having improved performance of a multi-integrated circuit system. The electrical isolation of the integrated circuit device 204 and the integrated circuit 230 enables independent operation and power management, such as supplying power at different voltages, of the integrated circuit device 204 and the integrated circuit 230, thus improving performance of a multi-integrated circuit system.

Figure 3:
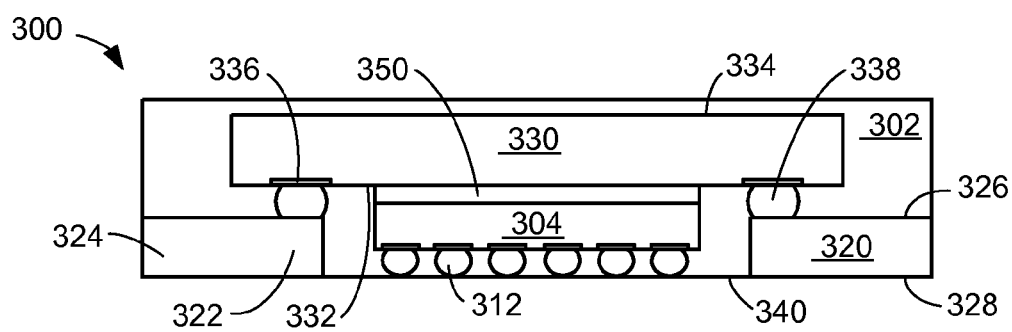
FIG. 3 is a cross-sectional view of an integrated circuit packaging system as exemplified by line 2—2 of FIG. 1 in a second embodiment of the present invention.

Referring now to FIG. 3, therein is shown a cross-sectional view of an integrated circuit packaging system 300 as exemplified by line 2-2 of FIG. 1 in a second embodiment of the present invention. The cross-sectional view depicts an integrated circuit device 304. The integrated circuit device 304 is a device having active circuitry fabricated thereto (not shown). As an example, the integrated circuit device 304 can be a thin integrated circuit die, an ultrathin integrated circuit die, or flip chip.

The integrated circuit device 304 can include external connectors 312. The external connectors 312 are conductive connectors that provide electrical connectivity for the integrated circuit device 304 to external devices. As an example, the external connectors 312 can be solder balls, solder bumps, or conductive bumps.

Leads 320 can be around the integrated circuit device 304. The leads 320 are conductive structures for mounting support and electrical connectivity of a device. The leads 320 can have a lead inner end 322, which faces the integrated circuit device 304, and a lead outer end 324, which faces away from the integrated circuit device 304. The leads 320 can have a lead top side 326 and a lead bottom side 328

The integrated circuit device 304 can be between and adjacent and the leads 320. The lead inner end 322 can be adjacent to the integrated circuit device 304. A vertical side of the lead inner end 322 can face a vertical side of the integrated circuit device 304. The leads 320 and the integrated circuit device 304 are not electrically connected.

The integrated circuit device 304 is electrically isolated from the leads 320. Electrically isolated means that the integrated circuit device 304 is not electrically connected to the leads 320 by the structures of the integrated circuit packaging system 300. This does not preclude that the leads 320 and the integrated circuit device 304 can be connected by the next system level (not shown).

An integrated circuit 330 can be mounted over and attached to the leads 320. The integrated circuit 330 is a semiconductor device. As an example, the integrated circuit 330 can be a thin integrated circuit die, an ultrathin integrated circuit die, or flip chip. The integrated circuit 330 can have a circuit active side 332 having active circuitry (not shown) fabricated thereto and a circuit non-active side 334. The circuit active side 332 of the integrated circuit 330 can face the lead top side 326.

The integrated circuit 330 can have bond pads 336 along the circuit active side 332 of the integrated circuit 330. The bond pads 336 are conductive pads that provide an electrical interface for connecting the integrated circuit 330 to other devices, components, or structures. As an example, the bond pads 336 can be made from a conductive material, such as copper, a copper alloy, gold, a gold alloy, nickel, a nickel alloy, or other alloys. The bond pads 336 can be co-planar with the circuit active side 332. The bond pads 336 can be located along an outer portion of the circuit active side 332.

The integrated circuit 330 can be attached to the lead inner end 322 with internal interconnects 338. The internal interconnects 338 are conductive structures for electrically connecting components. The internal interconnects 338 can connect the bond pads 336 with the lead inner end 322 along the lead top side 326. Examples of the internal interconnects 338 are solder balls, solder bumps, conductive posts, or conductive pillars.

The integrated circuit 330 can be over the integrated circuit device 304. The circuit active side 332 of the integrated circuit 330 can face the integrated circuit device 304. The integrated circuit 330 can be electrically isolated from the integrated circuit device 304. Electrically isolated means that the integrated circuit device 304 is not electrically connected to the integrated circuit 330 with the structures of the integrated circuit packaging system 300.

The integrated circuit 330 can be mounted over the integrated circuit device 304 with an adhesive 350. The adhesive 350 is an adhesive material for bonding components. As an example, the adhesive 350 can be a thermally conductive adhesive material, a polymer based adhesive material, or any other adhesive material suitable for bonding components. The adhesive 350 can be optional.

The adhesive 350 can form a physical barrier between the integrated circuit device 304 and the integrated circuit 330. The adhesive 350 can have electrically insulating properties and can electrically isolate the integrated circuit 330 and the integrated circuit device 304.

The integrated circuit packaging system 300 can include a package encapsulation 302. The package encapsulation 302 is a cover, such as a protective covering, that has electric and environmental insulating properties. As an example, the package encapsulation 302 can be formed by molding an encapsulation material such as epoxy molding compound or ceramic material. As an example, the package encapsulation 302 can have characteristics of being formed by a film assisted molding process.

The package encapsulation 302 can cover the integrated circuit 330 and the internal interconnects 338. The package encapsulation 302 can cover the leads 320 and the integrated circuit device 304. The lead outer end 324 can be exposed from and co-planar with a vertical side of the package encapsulation 302.

The package encapsulation 302 can have an encapsulation base 340. The lead bottom side 328 and a portion of the external contacts of the integrated circuit device 304 can be exposed along the encapsulation base 340. The lead bottom side 328 can be co-planar with the encapsulation base 340.

The lead bottom side 328 and the external connectors 312 exposed from the encapsulation base 340 can provide the integrated circuit packaging system 300 having inputs and outputs (I/O) of different types and densities. For example, the external connectors 312 can provide a greater number of connections, and thus a higher density of connections, for the integrated circuit device 304 relative to the number of connections provided by the leads 320. As a further example, the external connectors 312 can provide a smaller contact area for connection relative to a larger contact area for the leads 320. In yet a further example, the leads 320 can provide larger contacts arranged along the outer portion of the encapsulation base 340 while the external connectors 312 can provide smaller contacts along the inner portion of the encapsulation base 340.

The package encapsulation 302 can electrically isolate the integrated circuit device 304 from and the leads 320 and the integrated circuit 330. The package encapsulation 302 can form a physical barrier and electrically insulate the integrated circuit device 304 from the leads 320. In the case where the integrated circuit packaging system 300 does not include the adhesive 350 between the integrated circuit 330 and the integrated circuit device 304, the package encapsulation 302 can electrically isolate the integrated circuit 330 and the integrated circuit device 304 by forming a physical barrier and insulating the integrated circuit device 304 from the integrated circuit 330.

Figure 4:
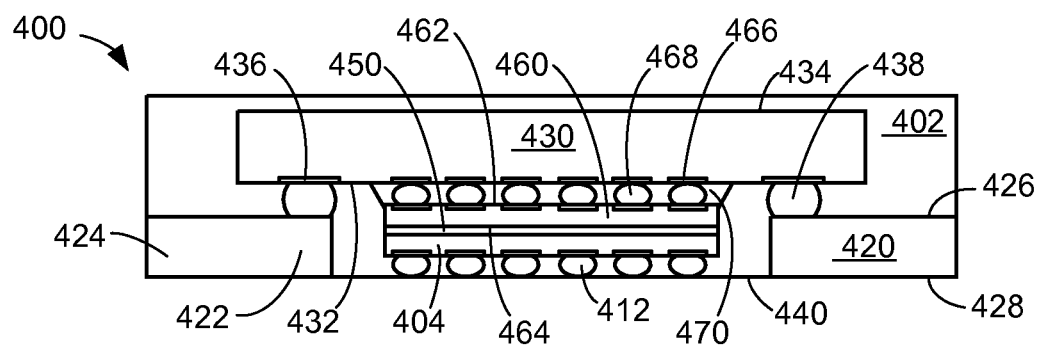
FIG. 4 is a cross-sectional view of an integrated circuit packaging system as exemplified by line 2—2 of FIG. 1 in a third embodiment of the present invention.

Referring now to FIG. 4, therein is shown a cross-sectional view of an integrated circuit packaging system 400 as exemplified by line 2—2 of FIG. 1 in a third embodiment of the present invention. The cross-sectional view depicts an integrated circuit device 404. The integrated circuit device 404 is a device having active circuitry fabricated thereto (not shown). As an example, the integrated circuit device 404 can be thin integrated circuit die, an ultrathin integrated circuit die, or a flip chip.

The integrated circuit device 404 can include external connectors 412. The external connectors 412 are conductive connectors that provide electrical connectivity for the integrated circuit device 404 to external devices. As an example, the external connectors 412 can be solder balls, solder bumps, or conductive bumps.

A mountable device 460 can be mounted over the integrated circuit device 404. The mountable device 460 is a device having active circuitry fabricated thereto (not shown). As an example, the mountable device 460 can be a thin integrated circuit die, an ultrathin integrated circuit die, or a flip chip. The mountable device 460 can have a mountable active side 462 and a mountable non-active side 464. The mountable active side 462 can face away from the integrated circuit device 404.

The mountable device 460 can be mounted on the integrated circuit device 404 with an adhesive 450. The adhesive 450 is an adhesive material for bonding components. As an example, the adhesive 450 can be a thermally conductive adhesive material, a polymer based adhesive material, or any other adhesive material suitable for bonding components.

The adhesive 450 can form a physical barrier between the integrated circuit device 404 and the mountable device 460. The adhesive 450 can have electrically insulating properties and can electrically isolate the mountable device 460 and the integrated circuit device 404. Electrically isolated means that the integrated circuit device 404 is not electrically connected to the mountable device 460.

Leads 420 can be around the integrated circuit device 404 and the mountable device 460. The leads are conductive structures for mounting support and electrical connectivity of a device. The leads 420 can have a lead inner end 422, which faces the integrated circuit device 404 and the mountable device 460, and a lead outer end 424, which away from faces the integrated circuit device 404 and the mountable device 460. The leads 420 can have a lead top side 426 and a lead bottom side 428.

The integrated circuit device 404 and the mountable device 460 can be between and adjacent to the leads 420. The lead inner end 422 can be adjacent to the integrated circuit device 404. A vertical side of the lead inner end 422 can face a vertical side of the integrated circuit device 404. The leads 420 and the integrated circuit device 404 are not electrically connected.

The integrated circuit device 404 is electrically isolated from the leads 420. Electrically isolated means that the integrated circuit device 404 is not electrically connected to the leads 420 by the structures of the integrated circuit packaging system 400. This does not preclude that the leads 420 and the integrated circuit device 404 can be connected by the next system level (not shown).

An integrated circuit 430 can be mounted over and attached to the leads 420. The integrated circuit 430 is a semiconductor device. As an example, the integrated circuit 430 can be a thin integrated circuit, an ultrathin integrated circuit, or a flip chip. The integrated circuit 430 can have a circuit active side 432 having active circuitry (not shown) fabricated thereto and a circuit non-active side 434. The circuit active side 432 of the integrated circuit 430 can face the lead top side 426.

The integrated circuit 430 can have bond pads 436 along the circuit active side 432 of the integrated circuit 430. The bond pads 436 are conductive pads that provide an electrical interface for connecting the integrated circuit 430 to other devices, components, or structures. As an example, the bond pads 436 can be made from a conductive material, such as copper, a copper alloy, gold, a gold alloy, nickel, a nickel alloy, or other alloys. The bond pads 436 can be co-planar with the circuit active side 432. The bond pads 436 can be located along an outer portion of the circuit active side 432.

The integrated circuit 430 can be attached to the lead inner end 422 with internal interconnects 438. The internal interconnects 438 are conductive structures for electrically connecting components. The internal interconnects 438 can connect the bond pads 436 with the lead inner end 422 along the lead top side 426. Examples of the internal interconnects 438 are solder balls, solder bumps, conductive posts, or conductive pillars.

The integrated circuit 430 can be mounted over and attached to the mountable device 460. The circuit active side 432 of the integrated circuit 430 can face the mountable active side 462 of the mountable device 460 with the structures of the integrated circuit packaging system 400. As an example, the mountable device 460 can be connected to the integrated circuit 430 at a wafer level.

The integrated circuit 430 can have routing pads 466, which are pads for routing signals along the circuit active side 432 and providing connection to devices and components. The mountable device 460 can connect to the routing pads 466 with mounting interconnects 468, which are conductive connectors that provide electrical connectivity between devices. As an example, the external connectors 412 can be solder balls, solder bumps, or conductive bumps.

An underfill 470 can be between the integrated circuit 430 and the mountable device 460. The underfill 470 can surround the mounting interconnects 468. The underfill 470 can be optional.

The integrated circuit 430 can be electrically isolated from the integrated circuit device 404. Electrically isolated means that the integrated circuit device 404 is not electrically connected to the integrated circuit 430. The adhesive 450 and the mountable device 460 provide a physical barrier which prevents direct electrical connection between the integrated circuit 430 and the integrated circuit device 404.

The integrated circuit packaging system 400 can include a package encapsulation 402. The package encapsulation 402 is a cover, such as a protective covering, that has electric and environmental insulating properties. As an example, the package encapsulation 402 can be formed by molding an encapsulation material such as epoxy molding compound or ceramic material. As an example, the package encapsulation 402 can have characteristics of being formed by a film assisted molding process.

The package encapsulation 402 can cover the integrated circuit 430, the mountable device 460, and the internal interconnects 438. The package encapsulation 402 can cover the leads 420 and the integrated circuit device 404. The lead outer end 424 can be exposed from and co-planar with a vertical side of the package encapsulation 402.

The package encapsulation 402 can have an encapsulation base 440. The lead bottom side 428 and a portion of the external contacts of the integrated circuit device 404 can be exposed along the encapsulation base 440. The lead bottom side 428 can be co-planar with the encapsulation base 440.

The lead bottom side 428 and the external connectors 412 exposed from the encapsulation base 440 can provide the integrated circuit packaging system 300 having inputs and outputs (I/O) of different types and densities. For example, the external connectors 412 can provide a greater number of connections, and thus a higher density of connections, for the integrated circuit device 404 relative to the number of connections provided by the leads 420. As a further example, the external connectors 412 can provide a smaller contact area for connection relative to a larger contact area for the leads 420. In yet a further example, the leads 420 can provide larger contacts arranged along the outer portion of the encapsulation base 440 while the external connectors 412 can provide smaller contacts along the inner portion of the encapsulation base 440.

The package encapsulation 402 can electrically isolate the integrated circuit device 404 from and the leads 420 and the integrated circuit 430. The package encapsulation 402 can form a physical barrier and insulate the integrated circuit device 404 from the leads 420.

Figure 5:
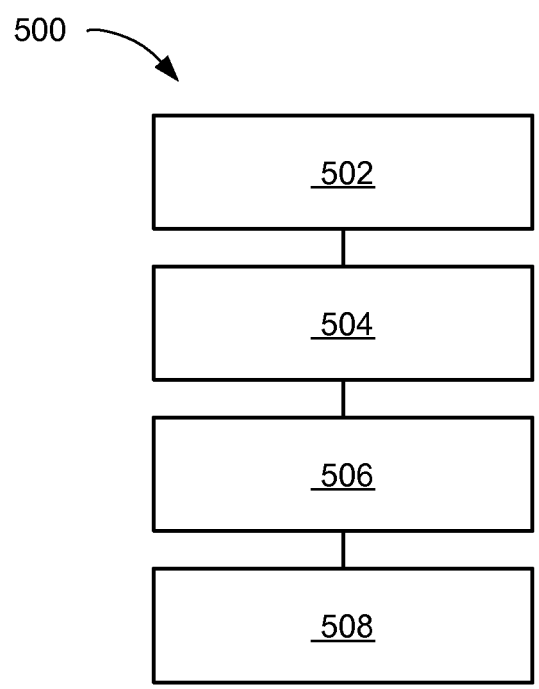
FIG. 5 is a flow chart of a method of manufacture of the integrated circuit packaging system in a further embodiment of the present invention.

Referring now to FIG. 5, therein is shown a flow chart of a method 500 of manufacture of the integrated circuit packaging system 100 in a further embodiment of the present invention. The method 500 includes: providing a lead in a block 502; placing an integrated circuit device, having an external connector, adjacent to and electrically isolated from the lead in a block 504; mounting an integrated circuit over the lead and the integrated circuit device with the integrated circuit electrically isolated from the integrated circuit device in a block 506; and forming a package encapsulation, having an encapsulation base, over the lead, the integrated circuit, and the integrated circuit device with the lead and the external connector exposed from the encapsulation base in a block 508.

Thus, it has been discovered that the integrated circuit packaging system of the present invention furnish or furnishes important and heretofore unknown and unavailable solutions, capabilities, and functional aspects for a flip chip. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems/fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a lead;
   placing an integrated circuit device, having an external connector, the integrated circuit device adjacent to and electrically isolated from the lead;
   mounting a mountable device, having a mountable active side, on the integrated circuit device, the mountable active side facing away from the integrated circuit device;

mounting an integrated circuit chip over the lead and the mountable device wherein a mounting interconnect is directly attached from the mountable device to a routing pad of the integrated circuit chip and the integrated circuit chip is connected to the lead; and forming a package encapsulation, having an encapsulation base, the package encapsulation encapsulates the lead, the integrated circuit chip, and the integrated circuit device with the lead and the external connector exposed from the encapsulation base.

2. The method as claimed in claim 1 wherein providing the integrated circuit device includes providing the integrated circuit device having a device encapsulation.

3. The method as claimed in claim 1 wherein mounting the integrated circuit chip includes mounting the integrated circuit chip over the integrated circuit device with an adhesive in between the integrated circuit device from the integrated circuit chip.

4. The method as claimed in claim 1
wherein:
mounting the integrated circuit chip includes mounting the mounting interconnect, the mounting interconnect is a solder ball.

5. The method as claimed in claim 1 wherein mounting the integrated circuit chip includes forming an underfill between the integrated circuit chip and the mountable device.

6. A method of manufacture of an integrated circuit packaging system comprising:
providing a lead having a lead inner end;
placing an integrated circuit device, having an external connector, the integrated circuit device adjacent to and electrically isolated from the lead with the lead inner end facing the integrated circuit device;
mounting a mountable device, having a mountable active side, on the integrated circuit device, the mountable active side facing away from the integrated circuit device;
mounting an integrated circuit chip over the lead inner end and the mountable device wherein a mounting interconnect is directly attached from the integrated circuit device to a routing pad of the integrated circuit chip and the integrated circuit chip is connected to the lead; and
forming a package encapsulation, having an encapsulation base, the package encapsulation encapsulates the lead, the integrated circuit chip, and the integrated circuit device with the lead and the external connector exposed from the encapsulation base.

7. The method as claimed in claim 6 wherein mounting the integrated circuit chip includes mounting the integrated circuit chip with a circuit active side of the integrated circuit chip facing a lead top side of the lead.

8. The method as claimed in claim 6 wherein mounting the integrated circuit chip includes mounting a flip chip.

9. The method as claimed in claim 6 wherein providing the integrated circuit device includes providing a packaged integrated circuit.

10. The method as claimed in claim 6 further comprising:
connecting an internal interconnect on a circuit active side of the integrated circuit chip; and
wherein:
mounting the integrated circuit chip includes mounting the integrated circuit chip over the lead inner end with the internal interconnect.

11. An integrated circuit packaging system comprising:
a lead;
an integrated circuit device, having an external connector, the integrated circuit device adjacent to and electrically isolated from the lead;
a mountable device, having a mountable active side, mounted on the integrated circuit device, the mountable active side facing away from the integrated circuit device;
an integrated circuit chip over the lead and the mountable device, the integrated circuit chip connected to the lead and having a routing pad;
a mounting interconnect directly attached from the integrated circuit device to the routing pad of the integrated circuit chip; and
a package encapsulation, having an encapsulation base, encapsulating the lead, the integrated circuit chip, and the integrated circuit device with the lead and the external connector exposed from the encapsulation base.

12. The system as claimed in claim 11 wherein the integrated circuit device includes a device encapsulation.

13. The system as claimed in claim 11 further comprising an adhesive between the integrated circuit chip and the integrated circuit device.

14. The system as claimed in claim 11 wherein the mounting interconnect is a solder ball.

15. The system as claimed in claim 11 further comprising an underfill between the integrated circuit chip and the mountable device.

16. The system as claimed in claim 11 wherein:
the lead includes a lead inner end adjacent to and facing the integrated circuit device; and
the integrated circuit chip is over the lead inner end.

17. The system as claimed in claim 16 a circuit active side of the integrated circuit chip faces a lead top side of the lead.

18. The system as claimed in claim 16 wherein the integrated circuit chip is a flip chip.

19. The system as claimed in claim 16 wherein the integrated circuit device is a packaged integrated circuit.

20. The system as claimed in claim 16 further comprising an internal interconnect between the integrated circuit chip and the lead inner end.

* * * * *